United States Patent [19]

Tseng

[11] Patent Number: 5,702,967
[45] Date of Patent: Dec. 30, 1997

[54] METHOD OF FABRICATING A DEEP SUBMICRON MOSFET DEVICE USING A RECESSED, NARROW POLYSILICON GATE STRUCTURE

[75] Inventor: Horng-Huei Tseng, Hsinchu, Taiwan

[73] Assignee: Vanguard International Semiconductor Corporation, Hsin-Chu, Taiwan

[21] Appl. No.: 684,804

[22] Filed: Jul. 22, 1996

[51] Int. Cl.$^6$ .................................................. H01L 21/266
[52] U.S. Cl. ......................... 437/45; 437/44; 437/983; 148/DIG. 111
[58] Field of Search ........................ 437/44, 45, 968, 437/983, 984; 148/DIG. 111, DIG. 117

[56] References Cited

U.S. PATENT DOCUMENTS

| | | | |
|---|---|---|---|
| 4,038,107 | 7/1977 | Marr et al. | 437/45 |
| 4,343,657 | 8/1982 | Ito et al. | 437/983 |
| 5,215,937 | 6/1993 | Erb et al. | 148/DIG. 111 |
| 5,399,508 | 3/1995 | Nowak | 437/44 |
| 5,422,301 | 6/1995 | Otsuki | 437/45 |
| 5,489,543 | 2/1996 | Hong | 437/44 |

*Primary Examiner*—Chandra Chaudhari
*Attorney, Agent, or Firm*—George O. Saile; Stephen B. Ackerman

[57] ABSTRACT

A process for fabricating a deep submicron MOSFET device gas been developed, preparing a narrow local threshold voltage adjust region in a semiconductor substrate, with the narrow local threshold voltage adjust region self aligned to an overlying, narrow polysilicon gate structure. The process consists of forming a narrow hole opening in an insulator layer, followed by an ion implantation procedure used to place the threshold voltage adjust region in the specific area of the semiconductor substrate, underlying the narrow hole opening. A polysilicon deposition, followed by an oxidation process, converts the unwanted polysilicon to a silicon oxide layer, while leaving unconverted polysilicon in the narrow hole opening. Removal of the oxidized polysilcon regions results in a narrow polysilicon gate structure, in the narrow hole opening, self aligned to the threshold voltage adjust region.

24 Claims, 5 Drawing Sheets

METHOD OF FABRICATING A DEEP SUBMICRON MOSFET DEVICE USING A RECESSED, NARROW POLYSILICON GATE STRUCTURE

BACKGROUND OF THE INVENTION

(1) FIELD OF THE INVENTION

The present invention relates to a process in which metal oxide semiconductor field effect transistor, (MOSFET), devices are fabricated, and more specifically to a process used to fabricate MOSFET devices with narrow polysilicon gate structures.

(2) DESCRIPTION OF PRIOR ART

Major objectives of the semiconductor industry have been to decrease the cost of semiconductor chips, while continuing to improve the performance of the semiconductor chip. The ability of the semiconductor industry to create devices with submicron features has allowed smaller chips to be used, thus resulting in a greater amount of chips to be obtained from a specific size starting substrate, ultimately reducing the manufacturing cost of a specific semiconductor chip. In addition semiconductor devices, specifically MOSFET devices, fabricated with submicron features, result in performance improvements, due to reduced parasitic capacitances and resistances, when compared to counterparts created with larger dimensions. The trend of the use of submicron features, in MOSFET devices, or micro-miniaturization has been realized via advances in specific semiconductor fabrication disciplines, mainly photolithograhy and anisotropic dry etching. For example the use of more sophisticated exposure cameras, as well as the development of more sensitive photoresist materials, has resulted in the routine attainment of submicron images in photoresist layers. In turn the development of reactive ion etching, (RIE), tools and processes, has allowed the submicron images in photoresist layers to be easily transferred to underlying materials used in the fabrication of semiconductor devices. However to continue to improve the performance of MOSFET devices, specific areas of the MOSFET device have to be properly engineered to optimize performance.

MOSFET devices with channel lengths less then 0.35 uM, or deep submicron MOSFET devices, are now being fabricated, resulting in improved device performance. The smaller features of the deep submicron MOSFET device results in a decrease in parasitic capacitances, which in turn results in a performance increase, when compared to MOSFET counterparts, fabricated with larger dimensions. However even with the use very narrow channel lengths for deep submicron MOSFET devices, specific regions of this deep submicron MOSFET device still exist, in which additional, undesired parasitic capacitance adversely influence performance. For example the threshold voltage adjust region, a region in which a level of doping, higher than the level of doping for the starting semiconductor substrate, is used to tailor the desired threshold voltage, results in unwanted junction capacitance, adversely influencing the performance of the deep, submicron MOSFET device.

This invention will describe a fabrication method for creating deep submicron MOSFET devices, in which the unwanted junction capacitance, resulting from a threshold voltage adjust region, is reduced. This is accomplished by restricting the width of threshold voltage adjust region to a width identical to the width of a narrow polysilicon gate structure. The ability to self align the narrow polysilicon gate structure to a local threshold voltage adjust region, is accomplished via a unique processing procedure, featuring an ion implantation step, in a hole opened in an insulator layer, to locally create the higher doping level, threshold adjust region. A polysilicon refill process, used to fill the hole in the insulator layer, followed by an oxidation, used to convert unwanted polysilicon to silicon oxide, and removal of the silicon oxide layer, result in the creation of a recessed, narrow polysilicon gate structure, self aligned to the local threshold voltage adjust region. Prior art such as Hong, et al., in U.S. Pat. No. 5,489,543, uses a threshold voltage adjust region formed via ion implantation through a polysilicon layer, and a gate insulator layer, into the underlying semiconductor substrate. The ability to accurately control the depth of the threshold adjust region is more difficult when implanting through multiple layers, such as polysilicon and gate insulators, as described by Hong, et al. This invention will describe a recessed, narrow polysilicon gate structure, formed after the creation of a local threshold voltage region, self aligned to the local threshold voltage adjust region via use of an opening in an insulator layer, used for both the threshold voltage adjust, and the recessed, narrow polysilicon gate structure definition.

SUMMARY OF THE INVENTION

It is an object of this invention to fabricate a deep submicron MOSFET device using a local threshold voltage adjust region.

It is another object of this invention to create a local threshold voltage adjust region, in a semiconductor substrate, via an ion implantation of dopants through a gate insulator layer, and into a local region of a semiconductor substrate, using a narrow hole opening, in an insulator layer, as a mask.

It is still another object of this invention to use a recessed, narrow polysilicon gate structure for the deep submicron MOSFET device, self aligned to a local threshold voltage adjust region.

It is still yet another object of this invention to create a recessed narrow polysilicon gate structure by completely filling the narrow hole opening in an insulator layer with polysilicon, followed by an thermal oxidation procedure, used to convert unwanted polysilicon to silicon oxide, and removal of the just created silicon oxide, resulting in the creation of a narrow polysilicon gate structure, recessed in the narrow hole opening in an insulator layer, self aligned to a local threshold voltage adjust region.

In accordance with the present invention a process for fabricating deep submicron MOSFET devices, using a narrow polysilicon gate structure, self aligned to a local threshold voltage adjust region, is described. An insulator layer is deposited on a semiconductor substrate. Photolithographic and reactive ion etching, (RIE), procedures are used to create a narrow hole opening in the insulator layer, to a channel region on the semiconductor substrate. A gate insulator layer is thermally grown on the surface of the semiconductor substrate, exposed in the narrow hole opening in the insulator layer. An ion implantation procedure is performed, through the gate insulator layer in the narrow hole opening, creating a local threshold adjust region, in the channel region of the semiconductor substrate. A polysilicon deposition is performed, completely filling the narrow hole opening in the insulator layer. A thermal oxidation procedure is used to convert the unwanted polysilicon to a silicon oxide layer, followed by removal of the silicon oxide layer, resulting in the creation of a narrow polysilicon gate structure, recessed in the narrow hole opening in the insulator layer, and directly overlying, and self aligned, to a local threshold adjust region. Lightly doped source and drain regions are next formed, followed by the deposition of another insulator layer, and anisotropic RIE procedures, used to create an insulator spacer on the sides of the narrow polysilicon gate structure. Heavily doped source and drain regions are next formed followed by contact metallization procedures.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Figure 1:
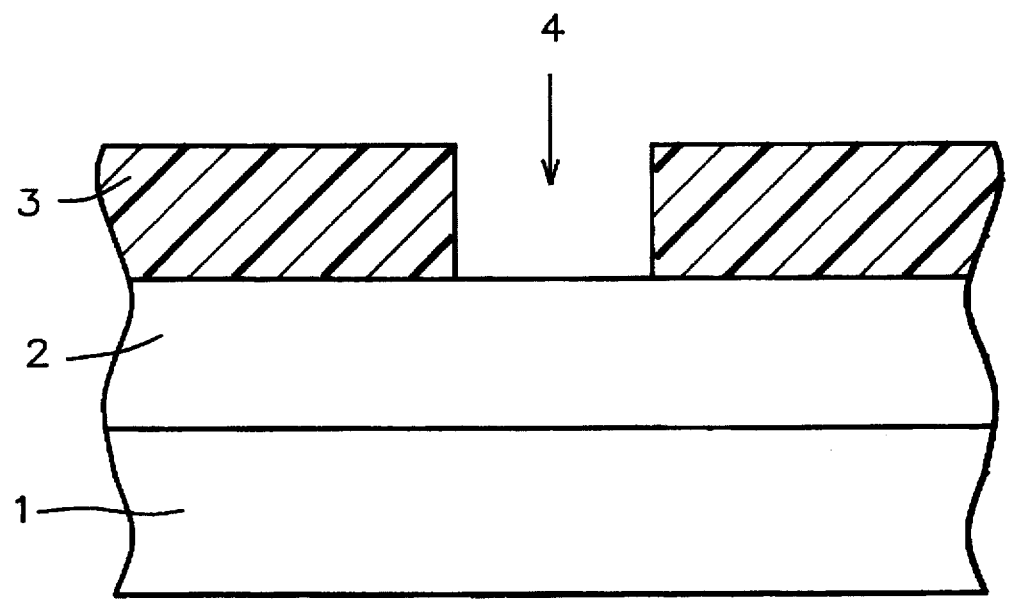
FIGS. 1–9, which schematically, in cross-sectional style, show the fabrication stages used to create a deep submicron MOSFET device, with a narrow polysilicon gate structure self aligned to an underlying local threshold voltage adjust region.
Figure 2:
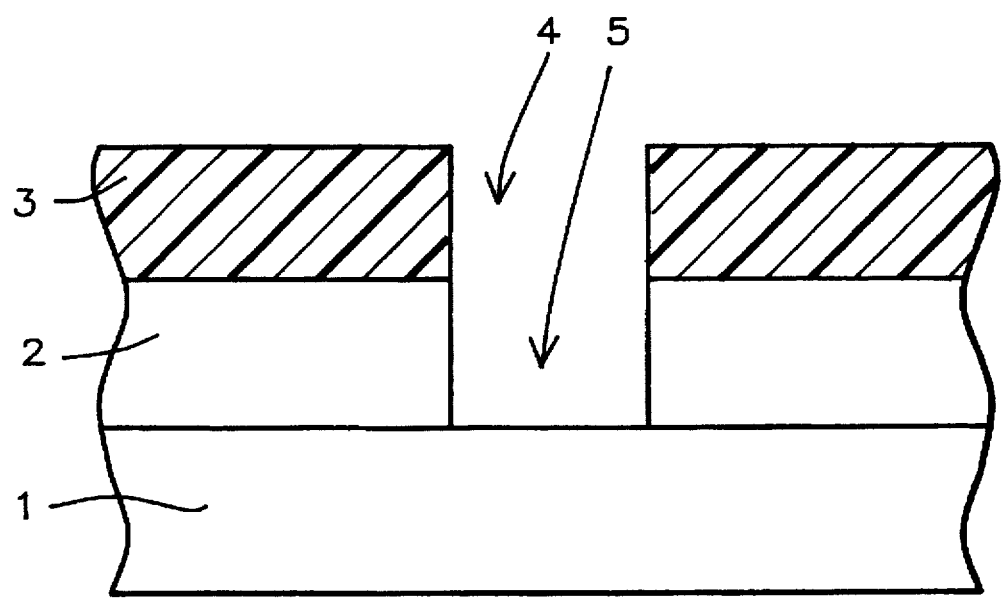

The method for creating a deep submicron MOSFET device will now be covered in detail. Deep submicron is referred to as a dimension of less than 0.35 uM in width, and a deep submicron MOSFET device is referred to a MOSFET device with a submicron channel length of less than 0.35 uM. A P type, single crystalline silicon substrate, 1, with a <100> crystallographic orientation, shown in FIG. 1, is used. Field oxide regions, (not shown in the drawings), comprised of between about 3000 to 6000 Angstroms of thermally grown silicon dioxide, are formed for purposes of isolation. A thick insulator layer of silicon oxide, 2, is next deposited using either low pressure chemical vapor deposition, (LPCVD), or plasma enhanced chemical vapor deposition, (PECVD), procedures, at a temperature between about 300° to 400° C., to a thickness between about 1500 to 3500 Angstroms. A photoresist layer, 3, with a narrow opening, or deep submicron opening, 4, between about 0.20 to 0.50 uM, in width, is next formed on the surface of insulator layer, 2. FIG. 2, shows the result of a RIE procedure, using $CHF_3$ as an etchant, performed to create a narrow hole opening, or a deep submicron hole opening, 5, in insulator layer, 2, using the narrow opening 4, in photoresist layer, 3, as a mask. The selectivity of the RIE procedure, using $CHF_3$ as an etchant, allows the etching procedure to terminate at the top surface of semiconductor substrate, 1, producing the narrow hole opening, 5, with a width identical to the width of the narrow opening, 4, in photoresist layer, 3, again between about 0.20 to 0.50 uM, in width.

Figure 3:
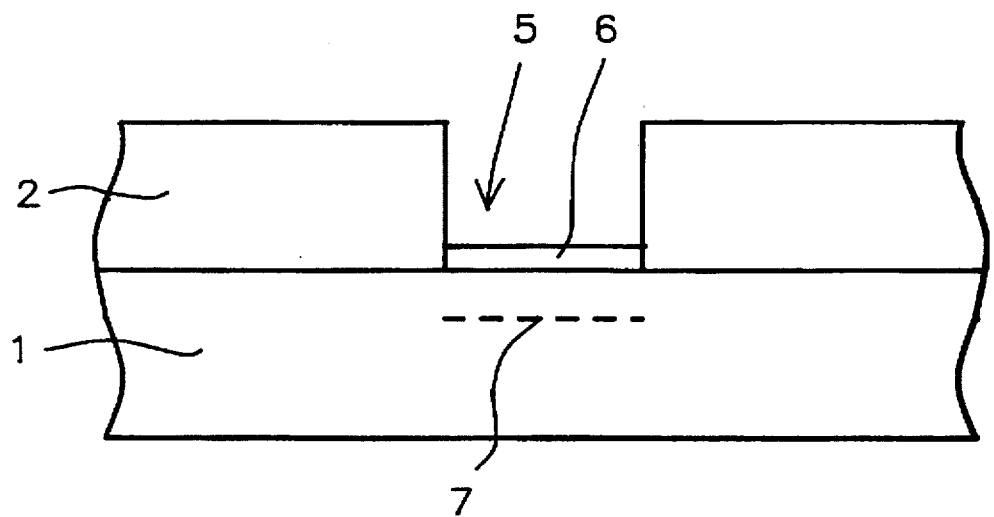

Photoresist layer, 3 is next removed via plasma oxygen ashing procedures and careful wet cleans. After a preclean using a dilute hydrofluoric solution, a silicon dioxide, gate insulator layer, 6, is thermally grown on the surface of semiconductor substrate, 1, exposed in narrow hole opening, 5. Gate insulator layer, 6, shown schematically in FIG. 3, is obtained via thermal oxidation in an oxygen—steam ambient, at a temperature between about 850° to 1000° C., to a thickness between about 50 to 200 Angstroms. A critical stage of this invention, the creation of a narrow, local threshold voltage adjust region, 7, is next addressed. In order to obtain the desired threshold voltage a region below a MOSFET gate has to have a higher doping level than the doping level of semiconductor substrate, 1. However if the region of higher doping is wide, an unwanted increase in junction capacitance will result. Therefore a procedure used to place the higher dopant, needed to obtain the desired threshold voltage, is performed only in a subsequent gate region, using narrow hole opening, 5, as a mask, creating a local threshold adjust region, 7, which will subsequently be self-aligned to a overlying polysilicon gate structure. This is accomplished via an ion implantation of boron, at an energy between about 10 to 30 KeV, at a dose between about 1E11 to 1E13 atoms/$cm^2$, producing local threshold voltage adjust region, 7, in semiconductor substrate, 1. This region is self aligned to the narrow hole opening, 5, thus this narrow, local region of higher doping will subsequently allow less junction capacitance to result then counterparts fabricated with wider, threshold voltage adjust regions. This region is shown schematically in FIG. 3.

Figure 4:
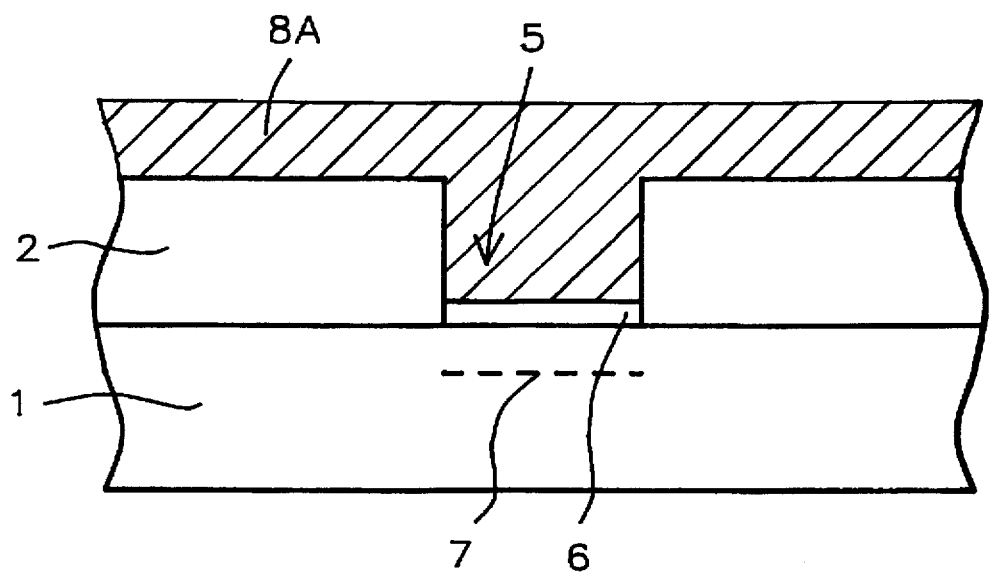
Figure 5:
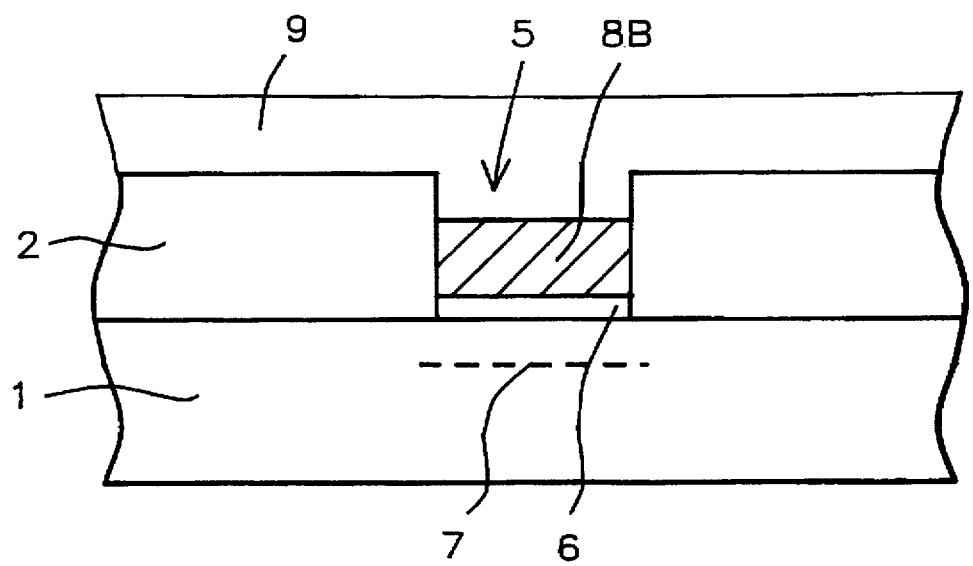

A polysilicon layer, 8a, shown schematically in FIG. 4, is next deposited using LPCVD procedures, at a temperature between about 525° to 575° C., to a thickness between about 1500 to 3000 Angstroms. Polysilicon layer, 8a, completely fills narrow hole opening, 5. Polysilicon layer, 8a, can be deposited intrinsically and doped via ion implantation of phosphorous or arsenic, at an energy between about 25 to 75 KeV, at a dose between about 1E14 to 1E16 atoms/$cm^2$, or polysilicon layer, 8a, can be grown using insitu doping procedures via the incorporation of either phosphine or arsine to the silane ambient. The unwanted regions of polysilicon layer, 8a, are next converted to a silicon oxide layer, 9, shown schematically in FIG. 5, via a thermal oxidation of polysilicon layer, 8a, in an oxygen—steam ambient, at a temperature between about 750° to 900° C. The oxidation process is performed for a period of time needed to completely convert all of polysilicon layer, 8a, overlying insulator layer, 2, to silicon oxide layer, 9. In addition, to account for possible polysilicon uniformity questions, the oxidation procedure is extended to a point in which between about 300 to 600 Angstroms of polysilicon layer, 8a, in narrow hole opening, 5, is consumed, and converted to silicon oxide. Therefore the resulting polysilicon gate structure, 8b, schematically shown in FIG. 5, is recessed in narrow hole opening, 5, resulting in polysilicon gate a width equal to the width of narrow hole opening, 5, and a height between about 1000 to 3000 Angstroms, self aligned to local threshold voltage adjust region, 7.

Figure 6:
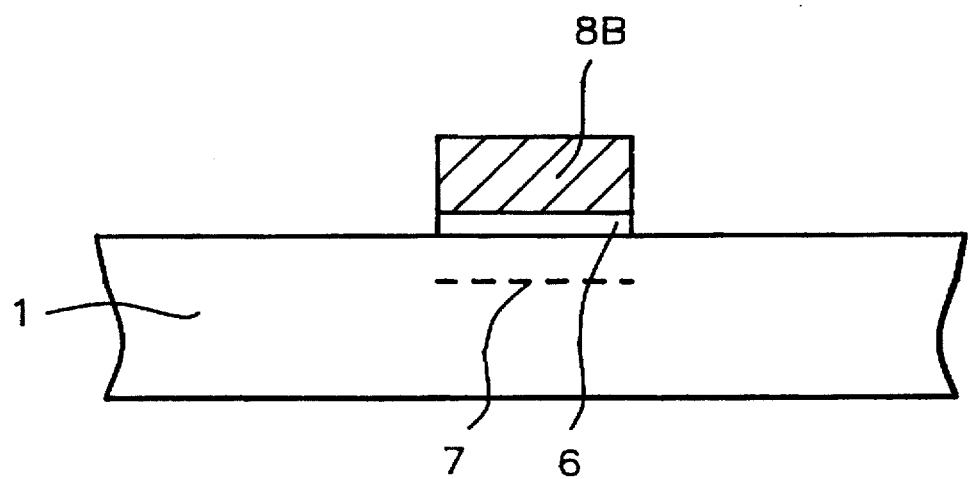
Figure 7:
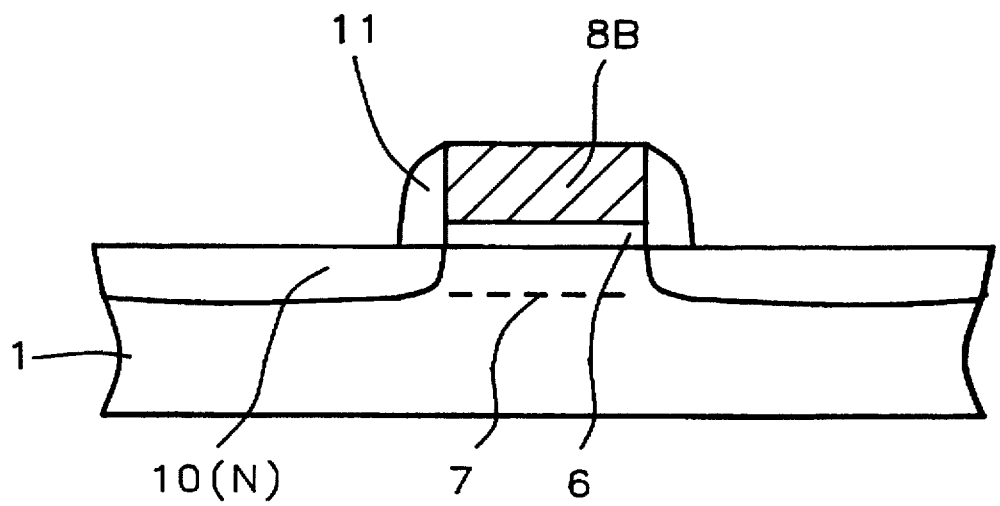
Figure 8:
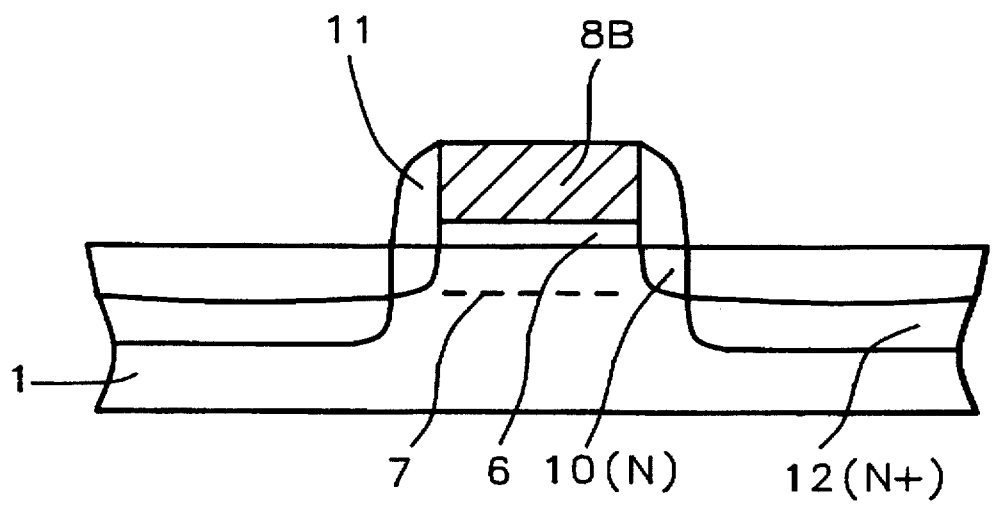

Silicon oxide layer, 9, as well as insulator layer, 2, are removed using a buffered hydrofluoric acid solution, or via selective RIE procedures, using $CHF_3$ as an etchant. The selective RIE procedure, including an overetch cycle, removes these insulator layers without attacking either semiconductor substrate, 1, or polysilicon gate structure, 8b, at endpoint. This is schematically shown in FIG. 6. Polysilicon gate structure, 8b, is next used as a mask to allow a lightly doped source and drain region, 10, to be created, via an ion implantation of phosphorous, at an energy between about 20 to 40 KeV, at a dose between about 1E13 to 1E14 atoms/$cm^2$. This is schematically shown in FIG. 7. Another insulator layer of silicon oxide, is next deposited using LPCVD or PECVD procedures, at a temperature between about 700° to 750° C., to a thickness between about 1000 to 2500 Angstroms, using tetraethylorthosilicate, (TEOS), as a source. An anisotropic, RIE procedure, using $CHF_3$ as an etchant, is used to create insulator spacer, 11, again schematically shown in FIG. 7. A heavily doped source and drain region, 12, shown schematically in FIG. 8, is formed via ion implantation of arsenic at an energy between about 30 to 100 KeV, at a dose between about 1E15 to 3E16 atoms/$cm^2$.

Figure 9:
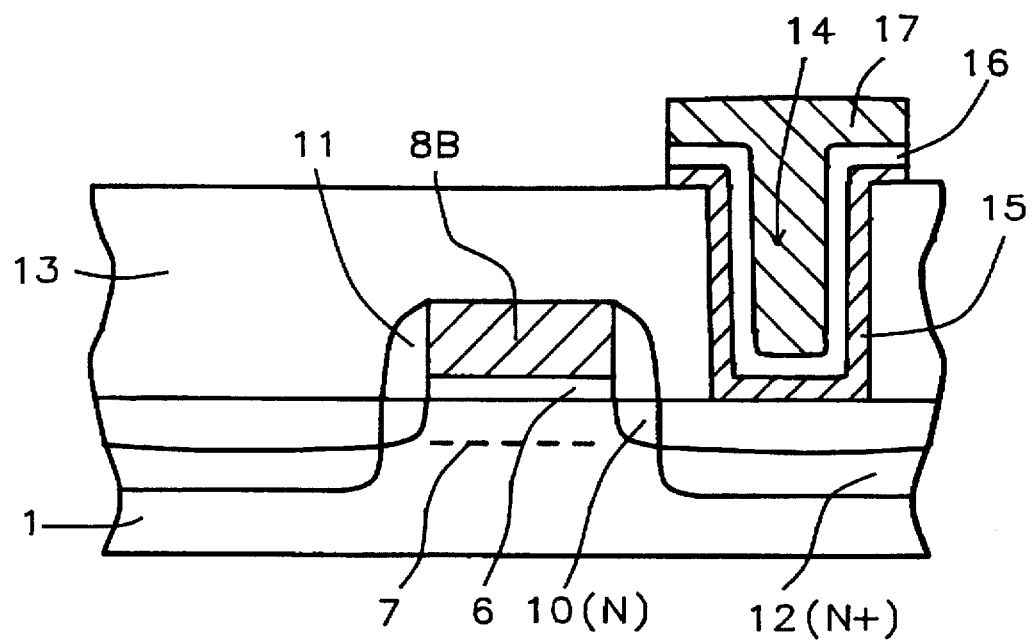

FIG. 9, schematically describes the processes used to create the metal contacts to the deep submicron MOSFET device. A silicon oxide layer, 13, is deposited using PECVD procedures, at a temperature between about 300° to 400° C., to a thickness between about 3000 to 8000 Angstroms. Conventional photolithographic and RIE procedures, using CHF$_3$ as an etchant, are used to create contact hole, 14, to heavily doped source and drain region, 12. An opening to polysilicon gate structure, 8b, is also created in silicon oxide layer, 13, however not shown in FIG. 9. The photoresist pattern, (not shown in FIG. 9), is then removed using plasma oxygen ashing and careful wet cleans. A metallization composite layer, comprised of an underlying layer of titanium, 15, at a thickness between about 250 to 750 Angstroms, and an overlying layer of titanium nitride, 16, is deposited using r.f. sputtering procedures, followed by the deposition of an aluminum based layer, 17, containing between about 1 to 3% copper, and between about 0.5 to 2% silicon, again using r.f. sputtering procedures, to a thickness between about 3000 to 8000 Angstroms. Conventional photolithographic and RIE procedures, using Cl$_2$ as etchant, are used to create the metal composite contact structure, of aluminum—titanium nitride—titanium, shown schematically in FIG. 9. Photoresist removal is once again accomplished using plasma oxygen ashing and careful wet cleans.

This process for creating a deep submicron MOSFET device, using a local threshold voltage adjust region, although shown for the creation of an N channel, of NFET device can easily be used to create a P channel, or PFET device. This process can also be used to fabricate complimentary, (CMOS), or bipolar, (BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with a narrow polysilicon gate structure self aligned to a narrow, local threshold voltage adjust region, comprising the steps of:

depositing a first insulator layer on said semiconductor substrate;

forming a photoresist pattern on said first insulator layer, with a narrow opening in said photoresist pattern, exposing top surface of said first insulator layer;

forming a narrow hole opening, in said first insulator layer, by removing said first insulator layer from narrow opening in said photoresist pattern;

removal of said photoresist layer;

thermal oxidation to grow a second insulator layer, to be used as a gate insulator layer, on the surface of said semiconductor substrate, exposed in said narrow hole opening;

ion implanting a first conductivity imparting dopant, through said second insulator layer, and into an area of said semiconductor substrate, defined by said narrow hole opening, to create said narrow local threshold adjust region;

depositing a polysilicon layer, on top surface of said first insulator layer, and completely filling said narrow hole opening;

oxidation to convert said polysilicon layer, on top surface of said first insulator layer, to a silicon oxide layer, while converting a top portion of said polysilicon layer, in said narrow hole opening, to said silicon oxide layer, leaving bottom portion of said polysilicon layer, in said narrow hole opening, unoxidized, resulting in formation of said narrow polysilicon gate structure, recessed in said narrow hole opening, self aligned to underlying said narrow local threshold voltage adjust region;

removal of said silicon oxide layer, from top surface of said first insulator layer, and from top surface of said narrow polysilicon gate structure, recessed in said narrow hole opening;

removal of said first insulator layer;

ion implanting a second conductivity imparting dopant into an area of said semiconductor substrate, not covered by said narrow polysilicon gate structure, to form a lightly doped source and drain region;

depositing a third insulator layer on said semiconductor substrate, and on said narrow polysilicon gate structure;

anisotropic etching of said third insulator layer, to form an insulator spacer on the sides of said narrow polysilicon gate structure;

ion implanting a third conductivity imparting dopant into an area of said semiconductor substrate, not covered by said narrow polysilicon gate structure, and not covered by said insulator spacer, to form a heavily doped source and drain region;

depositing a fourth insulator layer on said semiconductor substrate, and on said narrow polysilicon gate structure;

opening a contact hole in said fourth insulator layer, to expose top surface of said heavily doped source and drain region, and to expose top surface of said narrow polysilicon gate structure;

depositing a composite metal layer on top surface of said fourth insulator layer, on top surface of said heavily doped source and drain region, and on top surface of said narrow polysilicon gate structure, exposed in said contact hole; and patterning of said composite metal layer, to form a composite metal contact structures to said heavily doped source and drain region, and to said narrow polysilicon gate structure.

2. The method of claim 1, wherein said first insulator layer is silicon oxide, deposited using LPCVD or PECVD procedures, at a temperature between about 300° to 400° C., to a thickness between about 1500 to 3500 Angstroms.

3. The method of claim 1, wherein said narrow opening, in said photoresist layer, is between about 0.20 to 0.50 uM, in width.

4. The method of claim 1, wherein said narrow hole opening, in said first insulator layer, is between about 0.20 to 0.50 uM, in width, formed via anisotropic RIE procedures, using CHF$_3$ as an etchant.

5. The method of claim 1, wherein said second insulator layer, used as said gate insulator layer, is silicon dioxide, thermally grown in an oxygen—steam ambient, at a temperature between about 850° to 1000° C., to a thickness between about 50 to 200 Angstroms.

6. The method of claim 1, wherein said first conductivity imparting dopant, used to create said narrow local threshold adjust region, in an area of said semiconductor substrate defined by said narrow hole opening in said first insulator layer, is boron, ion implanted at an energy between about 10 to 30 KeV, at a dose between about 1E11 to 1E13 atoms/cm$^2$.

7. The method of claim 1, wherein said polysilicon layer, used to completely fill said narrow hole opening in said first insulator layer, is deposited using LPCVD procedures, at a temperature between about 525° to 575° C., to a thickness between about 1500 to 3000 Angstroms.

8. The method of claim 1, wherein said silicon oxide layer is formed via thermal oxidation in an oxygen—steam ambient, at a temperature between about 750° to 900° C., to a thickness between about 3000 to 6000 Angstroms, on top surface of said first insulator layer, and to a thickness between about 3600 to 7200 Angstroms, on said polysilicon layer, in said narrow hole opening.

9. The method of claim 1, wherein said silicon oxide layer, and said first insulator layer, are removed either via RIE procedures, using CHF$^3$ as an etchant, or via use of a buffered hydrofluoric acid solution, exposing said narrow polysilicon gate structure, between about 0.20 to 0.50 uM, in width, and between about 1000 to 3000 Angstroms, in thickness.

10. The method of claim 1, wherein said second conductivity imparting dopant, used to create said lightly doped source and drain regions, is phosphorous, ion implanted at an energy between about 20 to 40 KeV, at a dose between about 1E13 to 1E14 atoms/cm$^2$.

11. The method of claim 1, wherein said third insulator layer, used for said spacer insulator, is silicon oxide, deposited using PECVD or LPCVD procedures, at a temperature between about 700° to 750° C., to a thickness between about 1000 to 2500 Angstroms.

12. The method of claim 1, wherein said third conductivity imparting dopant, used to create said heavily doped source and drain regions, is arsenic, ion implanted at an energy between about 30 to 100 KeV, at a dose between about 1E15 to 3E16 atoms/cm$^2$.

13. A method of fabricating a deep, submicron MOSFET device, on a semiconductor substrate, with a narrow polysilicon gate structure, self aligned to a local threshold voltage adjust region, comprising the steps of:

depositing a first insulator layer on said semiconductor substrate;

forming a photoresist pattern on said first insulator layer, with a deep submicron opening in said photoresist pattern, exposing top surface of said first insulator layer;

forming a deep submicron hole opening, in said first insulator layer, by removing said first insulator layer, from an area defined by said deep submicron opening in said photoresist pattern;

thermal oxidation to grow a second insulator layer, to be used as a gate insulator layer, on the surface of said semiconductor substrate, exposed in said deep submicron hole opening;

ion implanting a first conductivity imparting dopant through said second insulator layer, and into an area of said semiconductor substrate, defined by said deep submicron hole opening, to create said local threshold voltage adjust region;

depositing a polysilicon layer, on top surface of said first insulator layer, and completely filling said deep submicron hole opening;

oxidation to convert said polysilicon layer, on top surface of said first insulator layer, to a silicon oxide layer, while converting a top portion of said polysilicon layer, in said deep submicron hole opening, to said silicon oxide layer, leaving bottom portion of said polysilicon layer, in said deep submicron hole opening, unoxidized, and forming said narrow polysilicon gate structure, recessed in said deep submicron hole opening, self aligned to underlying, said narrow local threshold voltage adjust region;

removal of said silicon oxide layer, from top surface of said first insulator layer, and from top surface of said narrow polysilicon gate structure, recessed in said deep submicron hole opening;

removal of said first insulator layer;

ion implanting a second conductivity imparting dopant into an area of said semiconductor substrate, not covered by said narrow polysilicon gate structure, to form a lightly doped source and drain region;

depositing a third insulator layer on said semiconductor substrate, and on said narrow polysilicon gate structure;

anisotropic etching of said third insulator layer to form an insulator spacer on the sides of said narrow polysilicon gate structure;

ion implanting a third conductivity imparting dopant into an area of said semiconductor substrate, not covered by said narrow polysilicon gate structure, and not covered by said insulator spacer, to form a heavily doped source and drain region;

depositing a fourth insulator layer on said semiconductor substrate, and on said narrow polysilicon gate structure;

opening a contact hole in said fourth insulator layer, to expose top surface of said heavily doped source and drain regions, and to expose top surface of said narrow polysilicon gate structure;

depositing a metal layer on the top surface of said fourth insulator layer, on the top surface of said heavily doped source and drain region, and on top surface of said narrow polysilicon gate structure, exposed in said contact hole; and patterning of said metal layer to form metal contact structures to said heavily doped source and drain region, and to said narrow polysilicon gate structure.

14. The method of claim 13, wherein said first insulator layer is silicon oxide, deposited using LPCVD or PECVD procedures, at a temperature between about 300° to 400° C., to a thickness between about 1500 to 3500 Angstroms.

15. The method of claim 13, wherein said deep submicron opening, in said photoresist layer, is between about 0.20 to 0.50 uM, in width.

16. The method of claim 13, wherein said deep submicron hole opening, in said first insulator layer, is between about 0.20 to 0.50 uM, in width, formed via anisotropic RIE procedures, using CHF$_3$ as an etchant.

17. The method of claim 13, wherein said second insulator layer, used as said gate insulator layer, is silicon dioxide, thermally grown in an oxygen—steam ambient, at a temperature between about 850° to 1000° C., to a thickness between about 50 to 200 Angstroms.

18. The method of claim 13, wherein said first conductivity imparting dopant, used to create narrow local threshold voltage adjust region, in an area of said semiconductor substrate defined by said deep submicron hole opening, is boron, ion implanted at an energy between about 10 to 30 KeV, at a dose between about 1E11 to 1E13 atoms/cm$^2$.

19. The method of claim 13, wherein said polysilicon layer, used to completely fill said deep submicron hole opening, in said first insulator layer, is deposited using LPCVD procedures, at a temperature between about 525° to 575° C., to a thickness between about 1500 to 3000 Angstroms.

20. The method of claim 13, wherein said silicon oxide layer is formed via thermal oxidation in an oxygen—steam ambient, at a temperature between about 750° to 900° C., to a thickness between about 3000 to 6000 Angstroms, on the top surface of said first insulator layer, while said silicon oxide layer, formed on top surface of said polysilicon layer, in said deep submicron hole opening, is between about 3600 to 7200 Angstroms.

21. The method of claim 13, wherein said silicon oxide layer, and said first insulator layer, are removed either via RIE procedures, using $CHF_3$ as an etchant, or via use of a buffered hydrofluoric acid solution, exposing said narrow polysilicon structure, with a width between about 0.20 to 0.50 uM, and a thickness between about 1000 to 3000 Angstroms.

22. The method of claim 13, wherein said second conductivity imparting dopant, used to create said lightly doped source and drain regions, is phosphorous, ion implanted at an energy between about 20 to 40 KeV, at a dose between about 1E13 to 1E14 atoms/$cm^2$.

23. The method of claim 13, wherein said third insulator layer, used for said spacer insulator, is silicon oxide, deposited using LPCVD or PECVD procedures, at a temperature between about 700° to 750° C., to a thickness between about 1000 to 2500 Angstroms.

24. The method of claim 13, wherein said third conductivity imparting dopant, used to create said heavily doped source and drain regions, is arsenic, ion implanted at an energy between about 30 to 100 KeV, at a dose between about 1E15 to 3E16 atoms/$cm^2$.

* * * * *